United States Patent
Hwang et al.

(10) Patent No.: US 6,340,609 B1
(45) Date of Patent: Jan. 22, 2002

(54) METHOD OF FORMING THIN FILM TRANSISTOR

(75) Inventors: Chang-Won Hwang, Sungnam-shi; Dong-Hwan Kim, Yongin-shi, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/709,648

(22) Filed: Nov. 13, 2000

(30) Foreign Application Priority Data

Nov. 11, 1999 (KR) ............................................. 99-49938

(51) Int. Cl.[7] .......................... H01L 21/00; H01L 21/84
(52) U.S. Cl. ...................... 438/151; 438/152; 438/166; 438/308
(58) Field of Search ............................ 257/57, 59, 66, 257/72, 412, 368, 413; 438/151, 152, 166, 308, 306

(56) References Cited

U.S. PATENT DOCUMENTS

| | | | | |
|---|---|---|---|---|
| 5,610,831 A | * | 3/1997 | Matsumoto | 364/491 |
| 5,893,730 A | * | 4/1999 | Yamazaki et al. | 438/166 |
| 6,133,073 A | * | 10/2000 | Yamazaki et al. | 438/151 |
| 6,180,957 B1 | * | 1/2001 | Miyasaka et al. | 257/57 |
| 6,252,249 B1 | * | 6/2001 | Yamazaki | 257/66 |
| 6,255,705 B1 | * | 7/2001 | Zhang et al. | 257/412 |
| 6,274,884 B1 | * | 8/2001 | Lee et al. | 257/72 |

* cited by examiner

Primary Examiner—Michael Lebentritt
(74) Attorney, Agent, or Firm—Howrey, Simon Arnold & White, LLP

(57) ABSTRACT

The present invention is related to the method of forming thin film transistor that can be used for flat display devices wherein a method of making TFT for display devices have the steps of, forming subsidiary conductor patterns connecting plurality of electrically isolated conductor patterns, implanting impurity ions utilizing the conductor patterns and subsidiary conductor patterns as implantation mask and removing the subsidiary conductor patterns.

14 Claims, 10 Drawing Sheets

METHOD OF FORMING THIN FILM TRANSISTOR

FIELD OF THE INVENTION

The present invention is related to the method of forming thin film transistor and more particularly related to the method of forming thin film transistor that can be used for display devices such as LCD (liquid crystal display), EL (electro luminescent display) device.

BACKGROUND OF THE INVENTION

Nowadays, the development of TFT (thin film transistor) technology is prominent. TFT is frequently used as switching device in a pixel of flat panel display like LCD and EL, and also used in module that is formed on glass substrate of the display panel.

Generally, TFT is formed on glass substrate. Semiconductor layer that is used as active layer containing channel and source/drain region of MOS (Metal Oxide Silicon) transistor is formed on glass substrate. Thus, gate pattern can be situated below the semiconductor layer as shown in bottom gate type TFTs. In bottom gate type TFTs, impurities may be doped to semiconductor layer by supplying impurity source gas when the semiconductor layer is deposited on a glass substrate.

On the other hand, in top gate type TFTs where the gate pattern is above semiconductor layer, impurity doping is executed by ion implanting. In the ion doping process, gate pattern take the role of ion implanting mask which prevent the channel region from being doped. Thus, the ions projected to channel regions are implanted in gate patterns and can be accumulated in the gate patterns which are isolated conductor patterns.

The accumulated ions raise the electrostatic potential of the gate patterns and may cause instant electric discharge accompanying spark between the gate patterns. And the spark usually destruct neighboring structure of patterns and electric isolations.

At this time, gate patterns mean a set of separated patterns including gate electrode, gate pad, gate line which are formed by patterning a gate layer. The location and separation of the gate patterns are decided by circuital arrangement of devices. And the sizes of area of the gate patterns can be varied. Above mentioned instant electric discharge usually happens between gate patterns whose sizes of area are significantly different and gap between them is small and on an active area.

FIG. 1 is planar view of part of panel substrate showing the electrostatic destruction caused by instant discharge between gate patterns. The destruction is caused when p type impurity ions generated from di-boron (mixture of B2H6 and H2) plasma are projected with the energy level of 50~65 keV and the does level of $5*10^{15}/cm^2$ to transistor area of polycrystalline silicon type TFT LCD. Two long latitudinal line patterns are long gate lines and rotated cup shape pattern is a small gate pattern. Rectangular area lying across the gate patterns longitudinally is active region. In the active region, long gate patterns and small gate pattern are facing each other along short gaps between them. And some parts of the gate patterns shown by some black points enclosed with the circle are burned by heat caused by the large amount of current through the semiconductor layer.

And, the current is generated by discharge between the gate patterns. In the burned points, some amounts of the semiconductor layer melt and then agglomerate or disappear by volatilization. Some amounts of gate insulation layer made of silicon dioxide also melt and then agglomerate or disappear by volatilization, which causes electrostatic destruction, the destruction of electric isolation. Thus, the transistor of this part does not work. Especially, if the transistor is one of the transistors which consist shift resister of peripheral circuit, signals cannot proceed to next shift resister and cannot be transferred to corresponding column or row. So, the whole next part of display panel cannot display any image.

FIG. 2a to FIG. 2d show some states of process for making top gate type TFT in polycrystalline type LCD. In the figures, only a part of peripheral circuit region is shown schematically, upper part is area for p impurity type transistor and lower part is area for n impurity type transistor.

According to FIG. 2a to FIG. 2d, active regions 210 and 230 are formed. Then, gate patterns of varied shape 410 and 430 are formed. Ion implanting mask 50 made of photoresist is formed to cover active regions 210 of p type transistor area and n type ions are implanted for source/drain region 211 for n type transistor. Then, the ion implanting mask 50 is removed. Inversely, Ion implanting mask 60 is formed to cover active regions 230 of n type transistor region and p type ions are implanted for source/drain region 231 for p type transistor.

For the whole transistor to be operated punctually, ion implanting should be executed with equivalent conditions through the whole substrate. Generally, the result of examination shows that impurity ion concentrations in active regions of the same impurity type transistor area are equal over the whole substrate. Thus, the amount of implanted ions per standard area is equivalent over the substrate and it is thought that there is no reason for difference in electric potential among the gate patterns according to the sizes of the gate patterns. Nevertheless, the instant discharge between gate patterns happen and the reason for instant discharge is considered to be temporal unbalance of regional amount of implanted ions. To prevent the discharge between the gate patterns and destruction of transistor function, it is suggested that the gate patterns should be designed to have similar size. Actually, in case that the gate patterns are similar in size, the frequency of instant to discharge among neighboring gate patterns decrease. However, the adoption of such design method cause many confinement in device design works, which generate different types of problems concerning wiring.

SUMMARY OF THE INVENTION

It is an object of the present invention to provide a method of making TFT for display devices wherein instant discharge between conductor patterns in the process of ion implanting can be prevented.

It is another object of the present invention to provide a method of making TFT for display devices wherein destruction of electric isolation in the process of ion implanting with no change of pattern design can be prevented.

In order to achieve above mentioned objects and other objects of the present invention, a method of making TFT for display devices have the steps of forming subsidiary conductor patterns connecting plurality of electrically isolated conductor patterns, implanting impurity ions utilizing the conductor patterns and subsidiary conductor patterns as implantation mask and removing the subsidiary conductor patterns.

According to the present invention, in the process of making TFT, if the step of ion implanting should be executed more than once, it is most preferable to form subsidiary conductor pattern and remove it for each step of ion implanting. However, the frequency of the instant discharge differs according to ion source gas, types of ions, energy level or does level for implanting. For example, ion implanting mask made of metal having good conductivity more frequently cause instant discharge than ion implanting mask made of semiconductor does. And the instant discharge frequently happen where gaps between the conductor patterns are short and difference of area for the conductor patterns is large. So, it can be more effective to form subsidiary conductor pattern only for such ion implanting steps that cause more frequent instant discharge and only for conductor patterns where the gaps between the conductor patterns are short.

According to the present invention, if one subsidiary conductor pattern can be used for more than one step of ion implanting, there is no need for removing it, if possible, until the last step of the ion implanting. At this time, the subsidiary conductor pattern should be formed not to prevent ion implanting to active regions where impurity doping is needed. And after the target step of ion implanting, the remained subsidiary conductor patterns should be removed not to interfere the punctual operation of devices.

Though the forming step and removing step of subsidiary conductor pattern may be executed only for their own, it is more preferable that the steps are made concurrently with other processing steps.

In the present invention, the conductor patterns and the subsidiary conductor patterns can be formed with doped semiconductors and metals where the carrier such as hole and electron can flow swiftly. If the ion implanting mask is made of non conducting materials or covered with non conducting material like photoresist, the implanted ions cannot move swiftly and do not cause instant discharge accompanying large amount of current (for conductor patterns) or prevent instant discharge (for subsidiary conductor patterns).

BRIEF DESCRIPTION OF THE DRAWINGS

The invention may be understood more clearly and its objects will become apparent to those skilled in the art by reference to the accompanying drawings as follows.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be through and complete, and will fully convey the scope of the invention to those skilled in the art.

For better understanding of the present invention, general aspect of polycrystalline type LCD, prior to preferred embodiment, may be mentioned. Polycrystalline silicon have still better mobility of carrier compared with amorphous silicon. So, TFT using polycrystalline silicon can be operated more swiftly than that using amorphous silicon and can be adopted in driving IC which is formed at once with switching transistor of pixel on a glass substrate. In that case, the cost for making and attaching module for display panel can be saved and the power consumption can be lowered.

But, in case of forming TFT for driving IC in a glass substrate, both p type impurity ions and n type impurity ions are to implant to the substrate in turn for CMOS transistor structure. In the step of n type ion implanting, channel area and active area for p type TFT are protected by gate pattern and subsidiary pattern and in the step of p type, vice versa.

Figure 1:
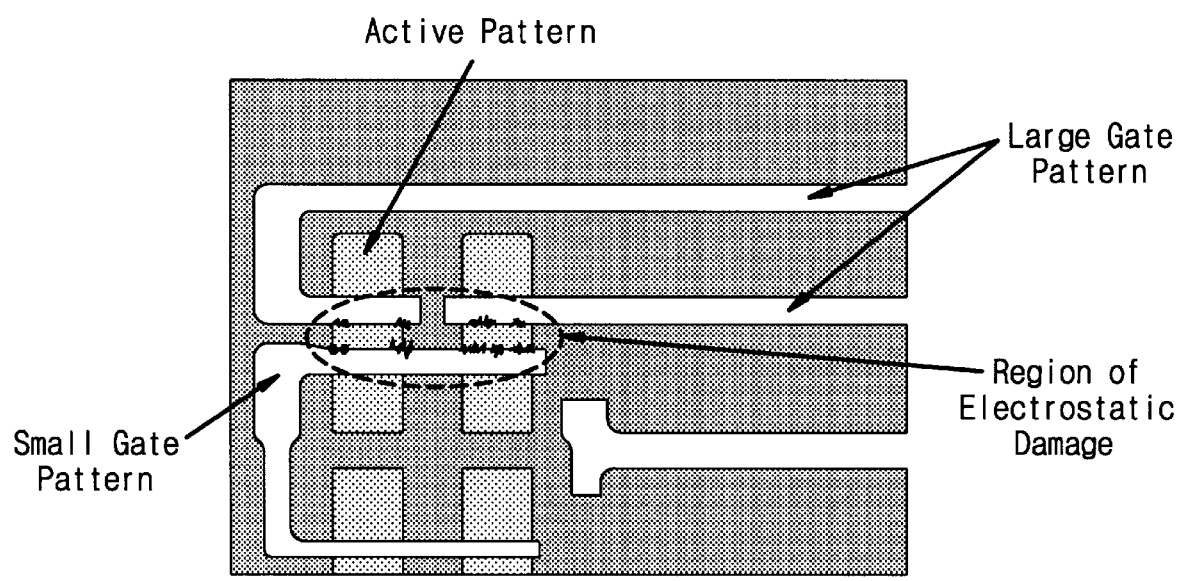
FIG. 1 shows plane view of part of panel substrate revealing the electrostatic destruction caused by instant discharge between gate patterns in prior art.
Figure 2A:
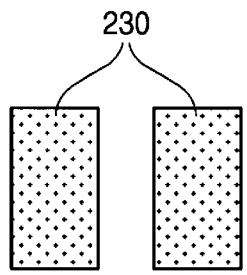
FIG. 2a to FIG. 2d show plane views at selected stages of process for making top gate TFT of polycrystalline type LCD in prior art.
Figure 2B:
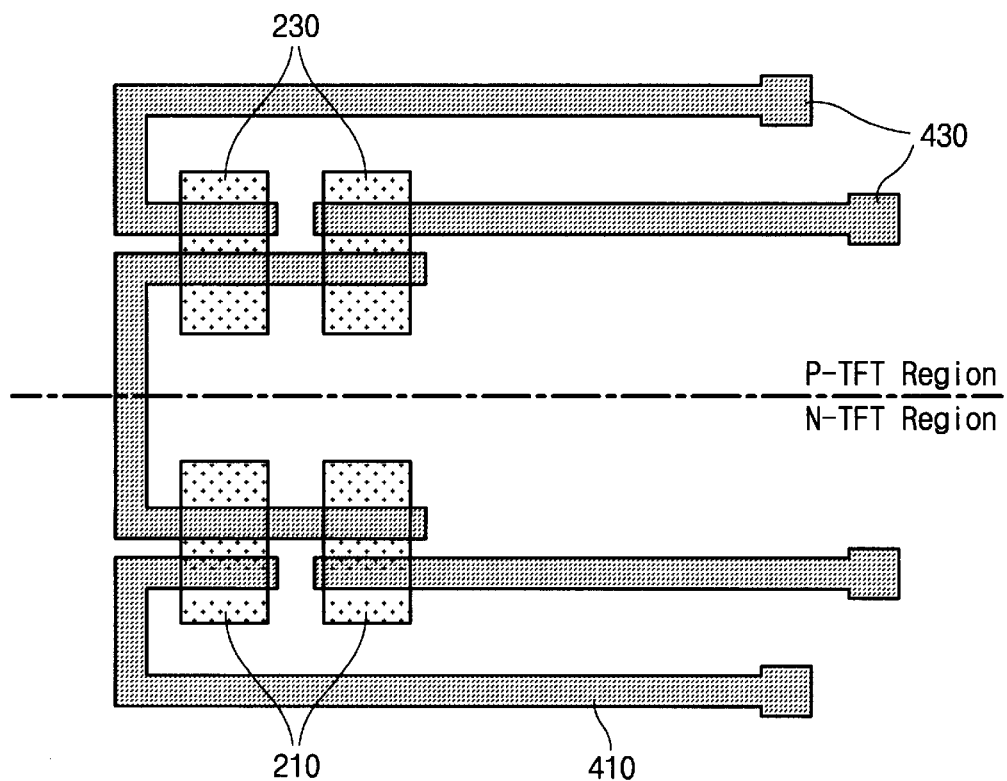
Figure 2C:
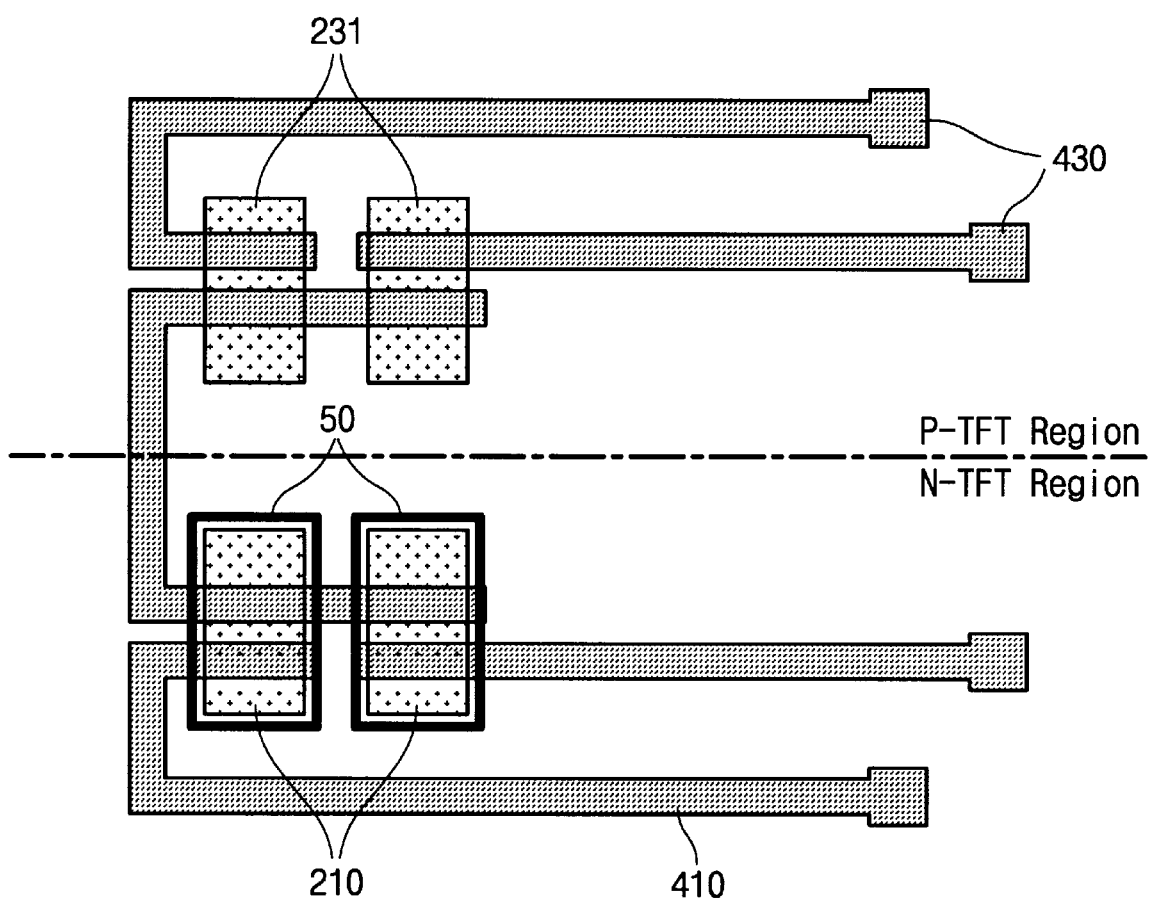
Figure 2D:
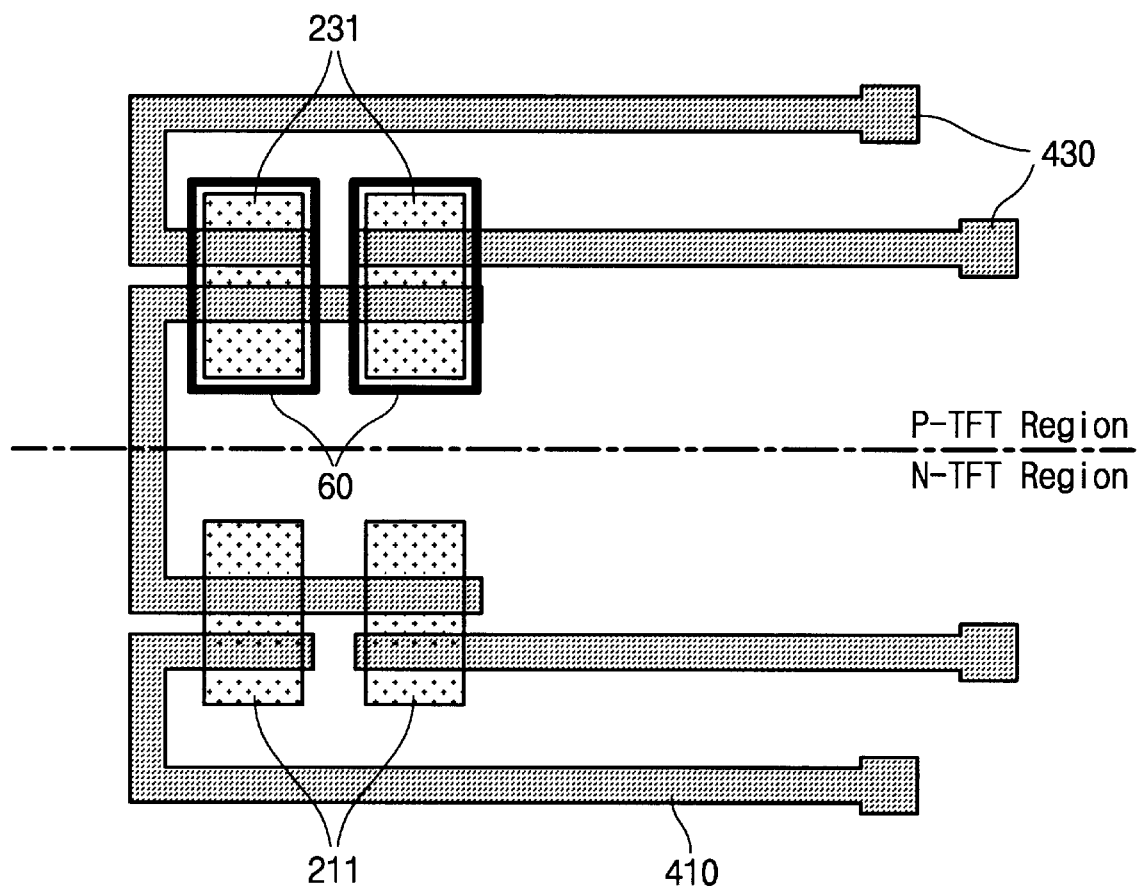
Figure 3A:
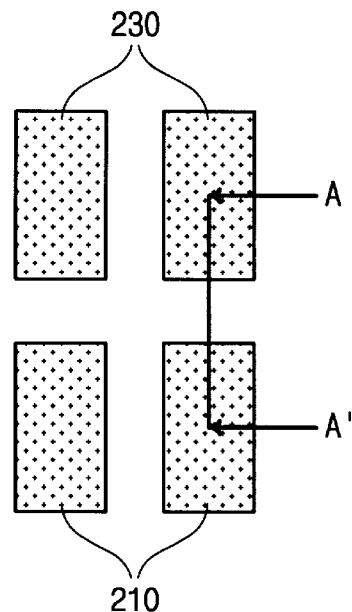
FIG. 3a to FIG. 3d show plane views corresponding to selected stages of process for making top gate TFT of polycrystalline type LCD in a preferred embodiment of the present invention.
Figure 4A:
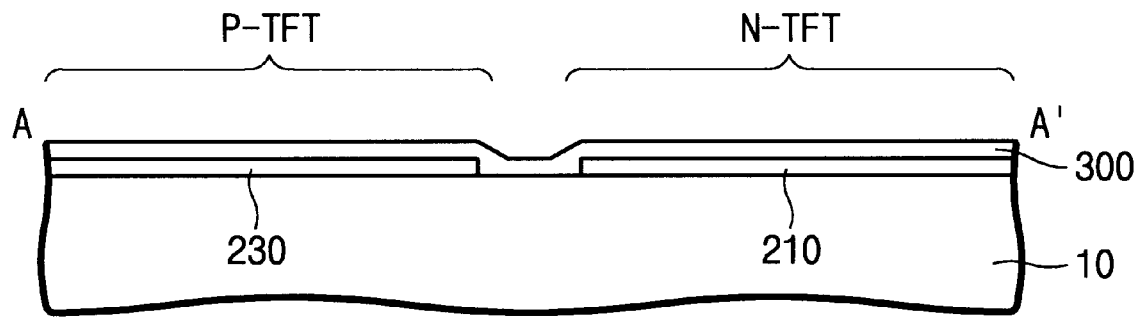
FIG. 4a to FIG. 4e show cross sectional views corresponding to cross sections cut by AA' line of FIG. 3a to FIG. 3d.

According to FIG. 3a and FIG. 4a, active regions or active patterns 210 and 230 are formed on a glass substrate 10. For the forming of active patterns 210 and 230, polycrystalline layer of thickness 500 to 800 angstroms is formed on glass substrate 10 and then the polycrystalline layer is patterned by general photolithography and etching process using photoresist. Polycrystalline layer can be formed by partial crystallization using laser scanning to amorphous silicon deposited on glass substrate. Gate insulating layer 300 is formed on the resulting structure including active patterns 210 and 230. Gate insulating layer is formed by depositing silicon oxide on the substrate to the thickness of about 1000 angstrom. Buffer layer of silicon oxide of thickness 2000 angstrom may well be deposited between glass substrate 10 and active patterns 210 and 230.

Figure 3B:
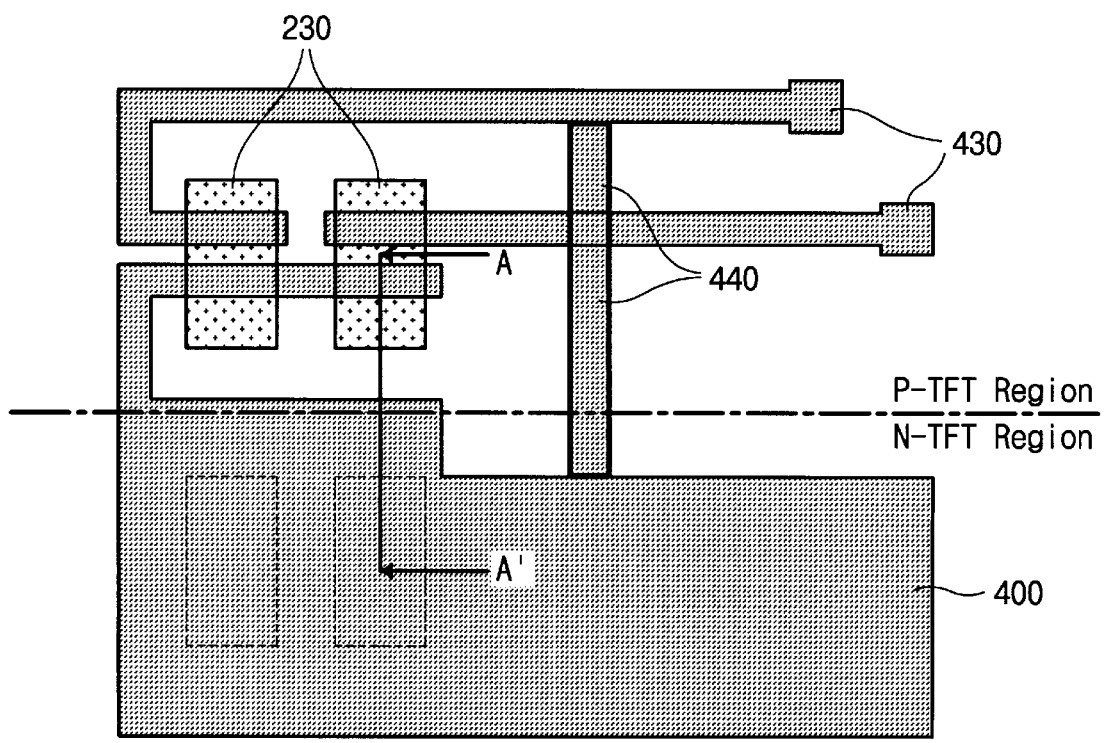
Figure 4B:
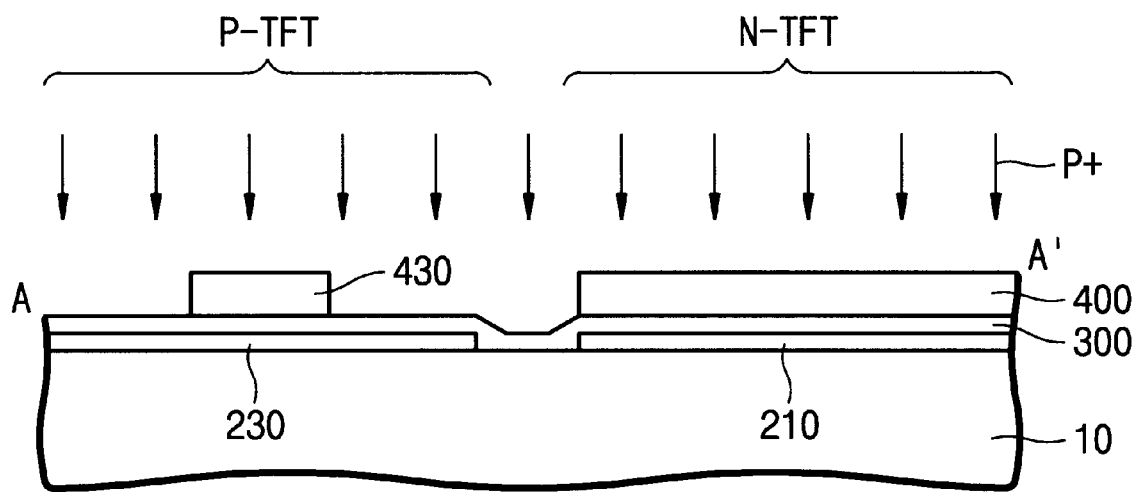

With reference to FIG. 3b and FIG. 4b, gate layer 400 is deposited on the resulting structure having gate insulating layer 300. Then, gate pattern 430 of p type transistor region is formed form the gate layer 400 by photolithography and etching process. Gate layer can be formed by sputtering aluminum containing metals like aluminum neodymium to the thickness of 2000 to 3000 angstroms. And then p type impurity ions are implanted to source/drain region of active pattern of p type transistor area. P type impurity ions are acquired from di-boron (mixture of B2F6 and F2) plasma and the impurity ions are accelerated with the energy level of 50 to 65 keV. Then the accelerated ions are projected to whole glass substrate with the does level of 5*10^15/cm^2. At this time, n type transistor area is wholly covered with gate layer 400. The part of gate layer covering the n type transistor area and gate pattern 430 are electrically connected by subsidiary conducting pattern 440.

Figure 3C:
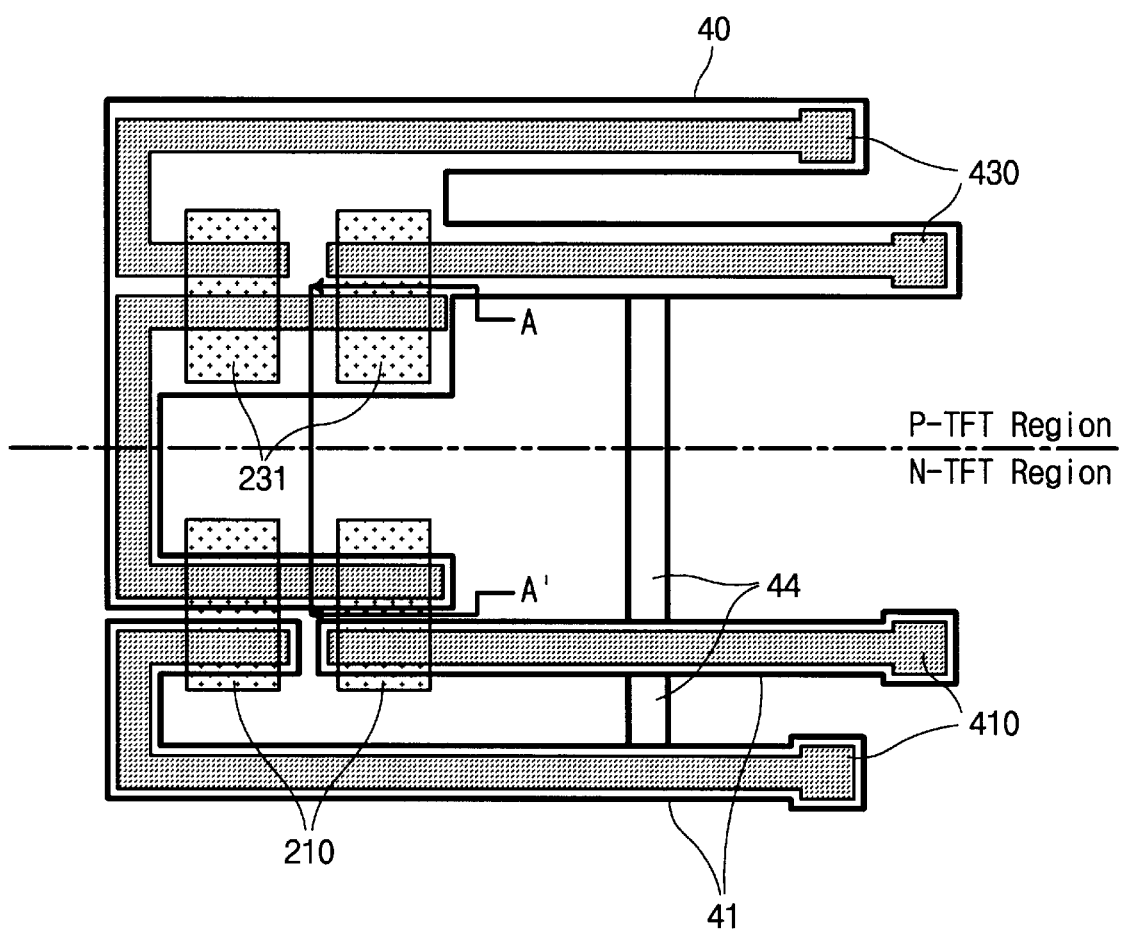
Figure 4C:
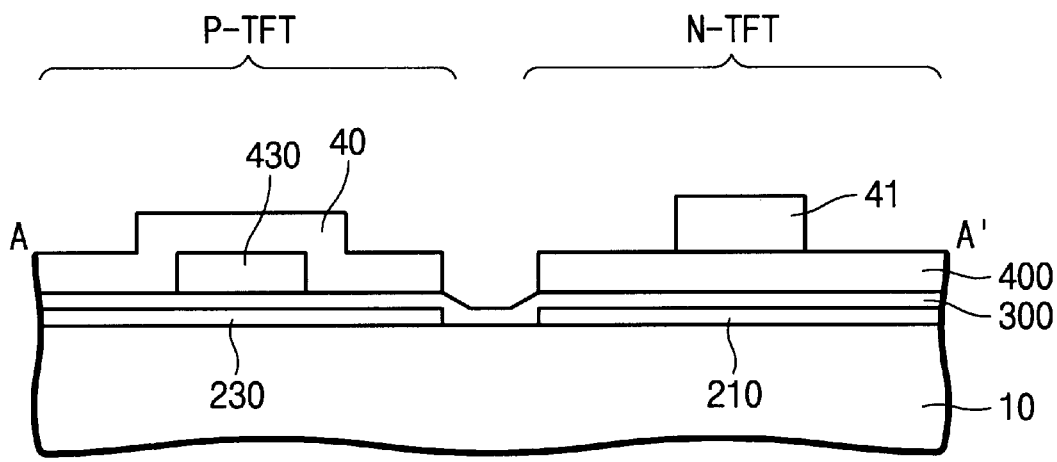

With reference to FIG. 3c and FIG. 4c, subsidiary gate layer 40 is formed over the resulting structure including gate pattern 430. The subsidiary gate layer 40 is formed with conducting material that has high etching selectivity to gate layer 400 such as chromium. The materials causing no difficulty in shaping undercut and in annealing process after ion implantation is preferred for subsidiary gate layer. Then, in n type transistor area, gate pattern 41 made with subsidiary gate layer 40 is formed by general patterning process. And, in turn, isotropic etching with the gate pattern 41 as etching mask is done to form gate pattern 410 made with gate layer 400 and to form undercut shape at the interface between gate pattern 41 and gate pattern 410. At this point, in p type transistor area, gate pattern 430 is covered with subsidiary gate layer 40. But, the subsidiary gate pattern 440 is not protected with subsidiary gate layer 40 so that the subsidiary gate pattern 440 is removed in the process of forming gate pattern 410 in n type transistor area. And, the gate pattern 41 and the part of subsidiary gate layer 40 covering p type transistor layer is connected with subsidiary gate pattern 44 made with subsidiary gate layer 40.

And then n type impurity ions are implanted to source/drain region of active pattern of n type transistor area. N type impurity ions are acquired from phosphine gas (mixture of PH3 and H2) plasma and the impurity ions are accelerated with the energy level of 80 to 95 keV. Then the accelerated ions are projected to whole glass substrate with the does level of $5*10^{15}/cm^2$. Active patterns of p type transistor area are wholly covered with subsidiary gate layer 40 so that there is no change of doping concentration in source/drain region of p type transistor area.

By the implantation of n type impurity ions, source/drain region of MOS transistor is made. By the way, in this embodiment of the present invention, the ion implantation makes an LDD(Lightly Doped Drain) or set off structure in n type transistor area. LDD or set off region exist both sides of channel between channel and deeply doped source/drain region. The LDD or set off structure is caused by the undercut structure. Under the condition of undercut structure, the gate pattern 41, the upper and wider layer in the folded gate patterns 41 and 410 act as implanting mask and thus the regions beside the gate pattern form un-doped or lightly doped region with a certain width(in case of LDD, generally 0.5 to 1.5 micro meter) corresponding to the difference between the gate pattern 410 and gate pattern 41.

Figure 3D:
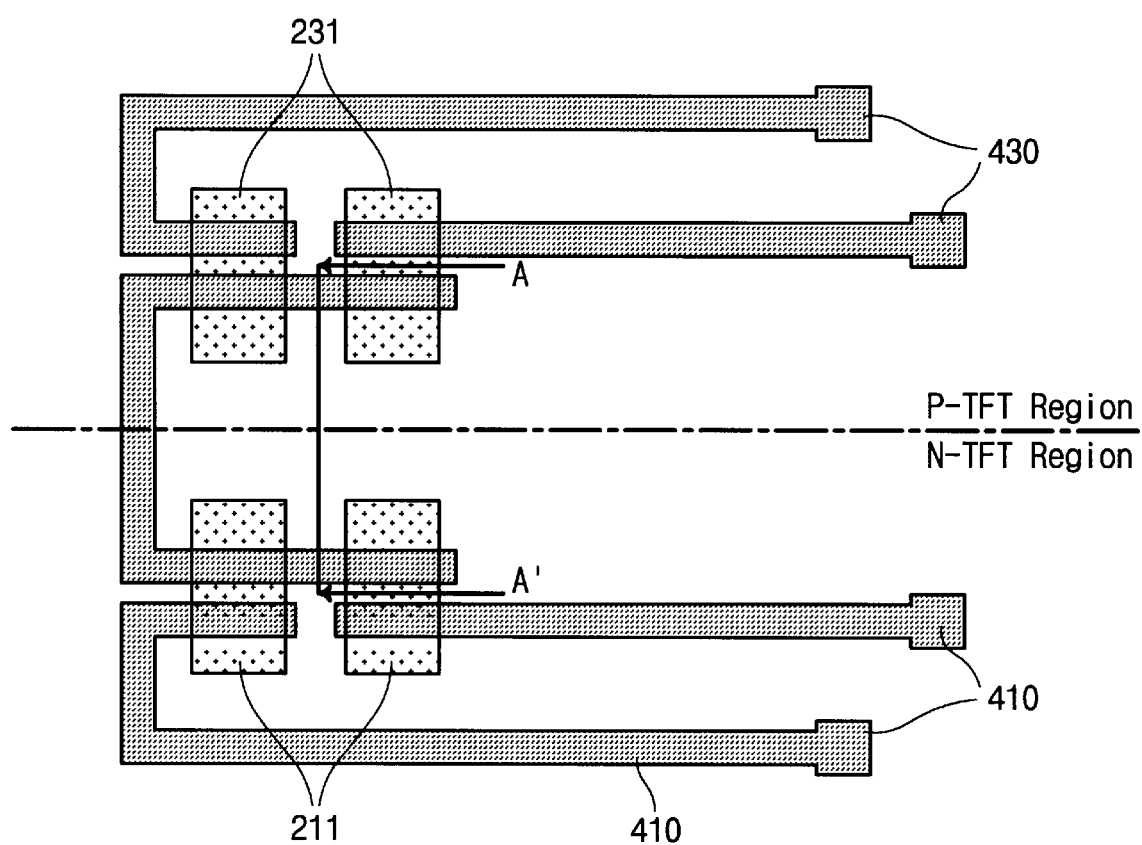
Figure 4D:
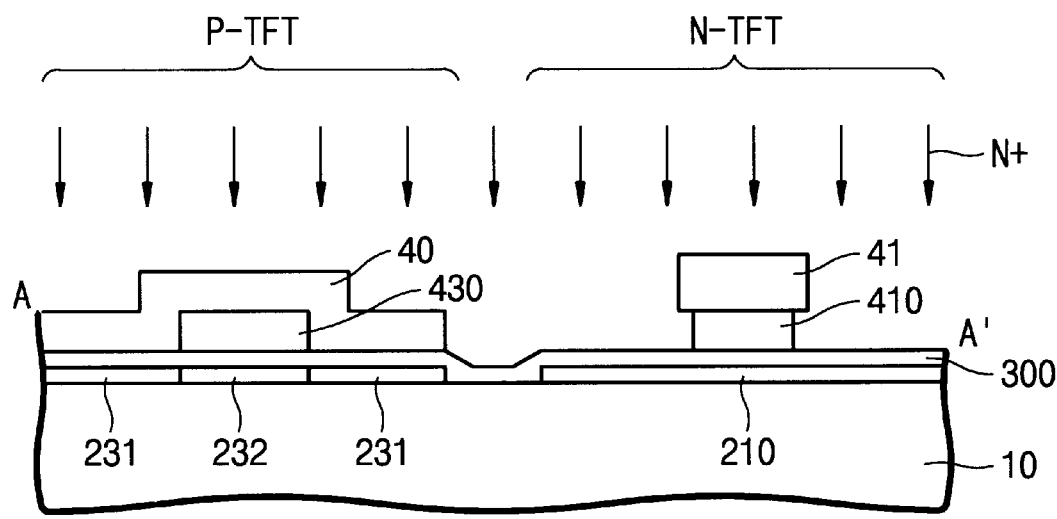
Figure 4E:
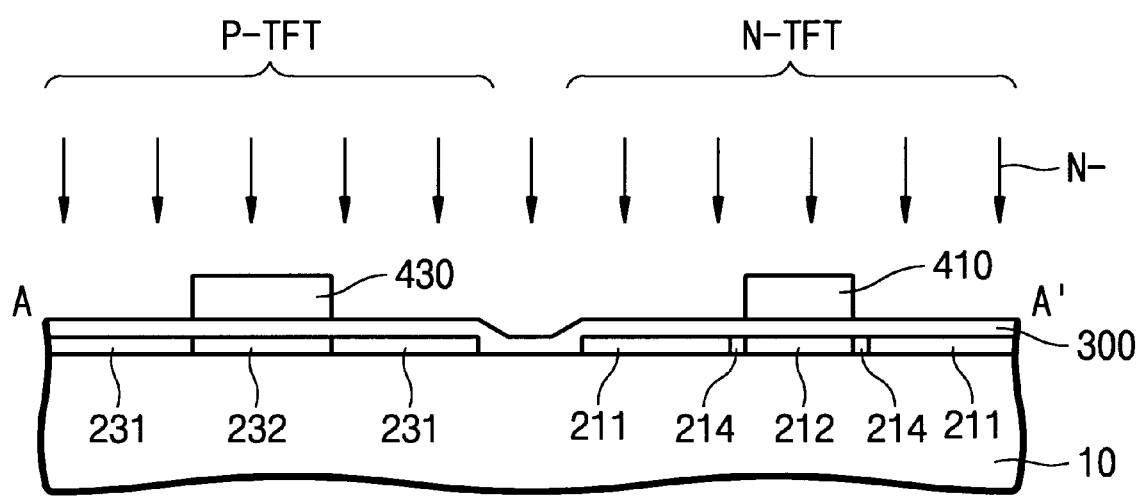

According to FIG. 3d and FIG. 4d, the residual subsidiary gate layer is removed to perform MOS transistor structure in p type transistor area and n type transistor area. Naturally, the subsidiary pattern 44 is also removed concurrently. If low does implanting of n type impurity ions under the level of $10^{12}/cm^2$ is implanted over the whole substrate, LDD structure is completed in n type transistor area. Because of the low does level, the p type transistor area is not influenced.

Though p type transistor is performed ahead of n type transistor in the above embodiment, the sequence can be reversed. Undercut structure may well be confined to the formation of N type transistor. Usually, after the step of ion implanting, annealing process is followed to compensate the crystal defect caused by the ion implanting. Through the process of annealing, the implanted impurity ions can be diffused and activated. Then, interlayer insulating layer is to be deposited and contact hole is formed by patterning the interlayer insulating layer. And, metal layer is deposited and patterned for wiring.

In the above embodiment, though only some patterns in the peripheral part of poly crystalline type LCD panel are considered, the present invention can be generally applied to patterns of display device in display region and in peripheral region.

The present invention can be applied only to troublesome parts where instant discharges frequently take place. However, in that case, other parts newly may become troublesome parts. So, for the throughout prevention of instant discharge from ion implanting, all conductor patterns had better be connected over the substrate.

By the present invention, in making TFTs for display devices, instant discharge between conductor patterns in the step of ion implanting can be effectively prevented and so destruction of electric isolation in the step of ion implanting can be prevented.

What is claimed is:

1. A method of making a thin film transistor (TFT), comprising the steps of:
   forming subsidiary conductor patterns connecting plurality of electrically isolated conductor patterns;
   implanting impurity ions utilizing the conductor patterns and subsidiary conductor patterns as implantation mask; and,
   removing the subsidiary conductor patterns.

2. The method of claim 1, wherein the TFT is to be used for a display device.

3. The method of claim 2, wherein the conductor patterns are made of metals.

4. The method of claim 2, wherein the conductor patterns are gate patterns of top gate type TFT, and
   wherein the implanting of impurity ions is executed to form source/drain region of TFT by using the gate patterns as implanting masks.

5. The method of claim 4, wherein the TFT is a p-type transistor of a polycrystalline silicon type LCD.

6. The method of claim 4, wherein the subsidiary conductor patterns are formed only where gaps between the conductor patterns are short and difference of area are large.

7. The method of claim 6, wherein the subsidiary conductor patterns are formed only the gaps are formed over a semiconductor layer.

8. The method of claim 2, wherein the subsidiary conductor patterns are formed for particular ion implanting steps of whole ion implanting steps.

9. The method of claim 2, wherein the subsidiary conductor patterns are formed by the same process in which conductor patterns are formed.

10. A method of forming TFTs for polycrystalline type TFT LCD (thin film transistor liquid crystal display) in which both p type and n type transistors are used, comprising steps of:
    forming a polycrystalline silicon layer on glass substrate and patterning the polycrystalline layer to form active regions;
    forming gate insulating layer and gate layer on the active regions;
    patterning the gate layer to cover one of two impurity (n and p) type transistor areas with the gate layer and to form gate patterns of the other impurity type transistor area and to form subsidiary gate patterns which connect all other gate layer residuals;
    implanting ions of the other type impurity with all the gate layer residuals as implanting mask;
    forming subsidiary gate layer on the substrate including the gate layer residuals;
    patterning the subsidiary gate layer to cover gate patterns and active regions of the other impurity type transistor area and to form gate patterns of the one impurity type area with the subsidiary gate layer and to form subsidiary gate patterns which connect all other subsidiary gate layer residuals;
    etching the gate layer with all the subsidiary gate layer residuals as etching mask;
    implanting ions of the one type impurity with all the subsidiary gate layer residuals as implanting mask; and
    removing all the subsidiary gate layer residuals.

11. The method of claim 10, wherein the one impurity type is p-type and, in the step of etching the gate layer, isotropic etching is done to form undercut shape between the gate patterns and the subsidiary gate patterns in the n-type transistor area.

12. The method of claim 11, further comprising implanting of n-type impurity ions with low does to form an LDD structure in the n-type transistor area.

13. The method of claim 11, wherein the gate layer is formed of aluminum containing metal and the subsidiary gate layer is formed of chromium.

14. The method of claim 10 wherein the one impurity is n-type.

* * * * *